United States Patent [19]

Mazin et al.

[11] Patent Number: 4,499,558
[45] Date of Patent: Feb. 12, 1985

[54] FIVE-TRANSISTOR STATIC MEMORY CELL IMPLEMENTAL IN CMOS/BULK

[75] Inventors: Moshe Mazin; William E. Engeler, both of Scotia, N.Y.

[73] Assignee: General Electric Company, Schenectady, N.Y.

[21] Appl. No.: 464,099

[22] Filed: Feb. 4, 1983

[51] Int. Cl.$^3$ ............................................. G11C 11/40
[52] U.S. Cl. ..................................... 365/182; 365/189
[58] Field of Search ............... 365/174, 182, 175, 189, 365/230

[56] References Cited

U.S. PATENT DOCUMENTS

| | | | |
|---|---|---|---|
| 3,493,786 | 2/1970 | Ahrons et al. | 307/279 |
| 3,521,242 | 7/1970 | Katz | 340/173 |
| 3,535,699 | 10/1970 | Gaensslen et al. | 340/173 |
| 3,813,653 | 5/1974 | Smith et al. | 340/173 |
| 4,063,225 | 12/1977 | Stewart | 365/156 |
| 4,150,441 | 4/1979 | Ando | 365/189 |
| 4,189,782 | 2/1980 | Dingwall | 365/190 |

Primary Examiner—Terrell W. Fears
Attorney, Agent, or Firm—Julius J. Zaskalicky; James C. Davis, Jr.; Marvin Snyder

[57] ABSTRACT

A five-transistor CMOS static random-access memory cell which does not require a voltage on the address line higher than the supply voltage to effect writing, and so may be fabricated employing CMOS technology on a bulk single-crystal semiconductor substrate. The cell includes a latch comprising a complementary pair of IGFETs for actively storing one binary logic state. For storing the other binary logic state, there is only a single pull-up transistor connected to one data node and a high-impedance leakage current discharge path for the other data node. The cell also includes a pair of input-/output gating transistors connected to the data nodes and operating in push-pull. Various forms of high impedance leakage current discharge path are disclosed, none of which require any increase in chip area. In one form, the high-impedance current discharge path comprises an IGFET having its gate tied to its drain terminal and having a channel extending between device regions which exist on the chip in any event for other purposes. In another form, a reverse-biased PN junction diode included in one of the gating transistors has sufficient conductivity to discharge leakage current to ground.

21 Claims, 4 Drawing Figures

FIVE-TRANSISTOR STATIC MEMORY CELL IMPLEMENTAL IN CMOS/BULK

BACKGROUND OF THE INVENTION

The present invention relates generally to static random-access memories of the type including a plurality of insulated-gate field-effect transistors (IGFETs) fabricated on a monolithic semiconductor chip and, more particularly, to a five-transistor static memory cell which can be fabricated employing complementary metal-oxide-semiconductor transistor technology on bulk single-crystal semiconductor substrates, referred to hereinafter as "CMOS/bulk".

As is well known, a digital random-access memory comprises a multiplicity of individual storage cells configured into a large array on an integrated circuit chip and suitably addressed, for example, by word and data bit lines. Each individual cell is capable, during a writing operation, of being set by an external signal into either of one of two distinct states. So long as power supply voltage continues, the cell remains in the set state indefinitely, or until it is changed to the other state by a subsequent writing operation. The state of the cell can be sensed during a reading operation to retrieve stored data, preferably in a non-destructive manner, i.e., which does not change the state of the memory cell.

In the design of large memory arrays, a critical design consideration is the number of memory cells that can be put on a chip, i.e., the packing density. To achieve a high packing density, the number of devices per memory cell must be small. Thus, in this respect, a five-transistor cell is preferable to a six-transistor cell. Indeed, reducing the per-cell transistor count by only one is significant. Other design considerations are minimizing power dissipation and ease of implementation. With respect to the design consideration of minimizing power dissipation, the type of latch circuit selected is important. For example, a known latch circuit having inherently low static power dissipation comprises a pair of cross-coupled inverters, with each inverter including a complementary pair of IGFETs, i.e., one N-channel IGFET and one P-channel IGFET. With respect to the design consideration of ease of implementation, it is preferable to design memory cells which can be implemented on bulk single-crystal substrates, in contrast to devices implemented employing silicon-on-insulator (SOI) technology, such as silicon-on-sapphire (SOS) technology. More generally, it is desirable to employ memory cells which can readily be fabricated employing conventional CMOS/bulk technology.

One general type of prior art static memory cell particularly pertinent in the context of the present invention includes a latch circuit of the type referred to above. Specifically, this type of memory cell comprises a pair of CMOS transistor inverters cross-coupled in a bistable latch or flip-flop configuration, with the output of each inverter connected to the input of the other inverter. Two complementary data nodes are thus defined. Each inverter includes one P-channel IGFET and one N-channel IGFET, with the IGFET gate terminals tied together and serving as the inverter input, and the IGFET drain terminals tied together and serving as the inverter output.

While such a memory cell comprising two cross-coupled CMOS inverters requires four transistors just to implement the latching function, it has the advantage of extremely low static power dissipation.

For writing data into and reading data from such memory cells, two general circuit techniques are known, as well as a number of variations.

In the first general circuit technique, a pair of input/output gating transistors operating in push-pull are employed. Thus, the complete cell requires six transistors, four in the latch and two in the gating circuitry. The gating transistors are respectively connected between the two data nodes and two external lines, DATA and $\overline{\text{DATA}}$, for both writing data into and reading data from the cell. The gating transistors are enabled at the same time for either a reading or a writing operation. For a reading operation, the DATA and $\overline{\text{DATA}}$ lines are coupled through the gating transistors to the two data nodes to assume the respective complementary logic states on the two data nodes. The condition of the DATA and $\overline{\text{DATA}}$ lines is then sensed by suitable sense circuitry, remote from the memory cell, but on the same semiconductor chip. For a writing operation, the DATA and $\overline{\text{DATA}}$ lines are driven by an external driver circuit to the proper logic states and, when the gating transistors are enabled, force the data nodes through a push-pull action to the desired logic state. By way of example, such a memory cell is disclosed in Ando U.S. Pat. No. 4,150,441.

Such a six-transistor memory cell, while quite suitable in operation, has the disadvantage that six transistors are required in its implementation.

The second general prior art circuit technique is to employ four transistors in the latch or flip-flop, but only a single gating transistor connected to just one of the data nodes. Thus, a five-transistor cell results. The single gating transistor is connected to a single input/output point of the memory cell, and is used to either sense the state of the cell for reading, or to write information into the cell for writing.

While the single gating transistor has the advantage of reducing transistor count, it has a disadvantage of making the writing operation more difficult to achieve in a reliable manner because the more forceful push-pull action available with two gating transistors is not available. In general, to write into the five-transistor cell, the impedance of the single gating transistor must be as low as possible to enable the cell to change state to accept new information. However, when reading the information contained in the cell, it is necessary that the gating transistor have a relatively high impedance in order to prevent residual voltages on the DATA line from overriding and altering the contents of the memory cell.

Several approaches have been employed for minimizing this problem. One general approach is to fabricate the gating transistor with an impedance sufficiently high that the cell can be read out non-destructively. When it is desired to write information into the cell, the control gate of the gating transistor is overdriven by employing a voltage higher than the normal supply voltage to the memory cell. The higher voltage is generated by an on-chip voltage multiplying circuit. This technique is described, for example, in Dingwall U.S. Pat. No. 4,189,782, and in the literature reference A. G. F. Dingwall and R. G. Stewart, "16K CMOS/SOS Asynchronous Static RAM", *IEEE Journal of Solid-State Circuits,* Volume SC-14, No. 5, pages 867-872 (October 1979).

Another approach is to apply normal gate voltage to the gating transistor during a writing operation, but to apply reduced supply voltage to the four latch transistors of the cell. An example of this technique is disclosed in Smith et al U.S. Pat. No. 3,813,653.

A significant disadvantage of either of these two approaches, i.e. either overdriving the gating transistor or reducing the cell supply voltage during a writing operation, is that implementation is not possible employing CMOS/bulk technology, i.e., fabricating devices on bulk single-crystal substrates, since no voltage build-up can be accomplished in CMOS/bulk. Rather, silicon-on-insulator (SOI) technology must be employed, such as silicon-on-sapphire (SOS), silicon-on-spinel, silicon-on-nitride, or silicon-on-oxide. The insulative substrate provides isolation between the individual transistor devices comprising the overall integrated circuit, permitting voltage differences which cannot exist in CMOS/bulk. Disadvantage of SOI technology, such as SOS technology, are relatively higher cost, interface leakage, and the great care which must be taken to minimize the number of defects in the silicon film comprising the device active portions.

SUMMARY OF THE INVENTION

Accordingly, it is an object of the invention to provide a five-transistor static memory cell which can be implemented in CMOS/bulk.

It is another object of the invention to provide such a memory cell which can be fabricated with minimal change from conventional fabrication technology.

Briefly, and in accordance with one aspect of the invention, there is provided a binary memory cell for connection to a pair complementary data input/output lines and to an address or WORD line carrying cell-enabling signals for addressing the cell. The memory cell includes a pair of voltage supply nodes, typically a positive voltage supply node ($+V_{DD}$) and a circuit reference or ground voltage supply node. The cell additionally includes first and second complementary data input/output nodes.

Directly associated with the data nodes is a latch for actively storing one of the logic states, for example, binary "0" wherein one of the data nodes is at logic low and the other of the data nodes is at logic high. The latch includes a complementary pair of IGFETs. One of the active latch transistors has a channel of one conductivity type, for example, N-channel conductivity type, arranged to selectively electrically connect the one data node to one of the voltage supply nodes, for example, to the ground voltage supply node. The other active latch transistor has a channel of opposite conductivity type, in this example, of P-channel conductivity type, and is arranged to selectively electrically connect the other data node to the other voltage supply node, in this example, to the $+V_{DD}$ supply node. To achieve latching operation, the gate of the one latch transistor (N-channel) is electrically connected to the other data node, and the gate of the other latch transistor (P-channel) is electrically connected to the one data node.

When a binary "0" is stored in the cell, both of the latch transistors are conducting, actively pulling the one data node to logic low and the other data node to logic high.

For storing the other digital logic state, i.e. binary "1" wherein the one data node is at logic high and the other data node is at logic low in this example, an active pull-up IGFET having a channel of the opposite conductivity type, in this example, a P-channel IGFET, is arranged to selectively electrically connect the one data node to the other voltage supply node ($+V_{DD}$). The gate of the active pull-up transistor is electrically connected to the other data node.

The other data node is not actively pulled low when a binary "1" is stored. However, in order to discharge any leakage current which would otherwise tend to increase the voltage on the other data node while a binary "1" is stored, a high impedance leakage current discharge path is provided electrically connecting the other data node to the one voltage supply node, in this example, circuit ground. As will be apparent from the description hereinbelow, the high impedance leakage current discharge path may take a variety of forms, and need not comprise a discrete resistor.

The cell also has a gating circuit including a pair of IGFETs. The channel of one gating IGFET is arranged to selectively electrically connect the one data node to one of the data lines, and the channel of the other gating transistor is arranged to selectively electrically connect the other data node to the other data line. The gates of the gating transistors are arranged for connection to the address line for controlling conduction through the channels of the gating transistors. Preferably, the gating transistors have channels of the one conductivity type, in this example, of N conductivity type.

Considering again the high impedance leakage current discharge path, in one specific form, for example, the high impedance leakage current discharge path comprises a leakage current path through a reverse-biased PN junction diode inherent in one of the gating transistors.

In another specific form, the high impedance leakage current discharge path comprises an enhancement-mode IGFET having a channel of the opposite conductivity type, e.g. a P-channel IGFET, which serves as a leakage transistor. The source of the leakage transistor is electrically connected to the other data node, and the drain connected to the one voltage supply node, e.g., circuit ground. The gate of the leakage transistor is also electrically connected to the one voltage supply node, and thus to the leakage transistor drain terminal. Thus, the leakage transistor is biased into conduction whenever voltage is applied between its source and drain terminals. The leakage transistor is configured so as to have a relatively lower conductivity relative to the conductivity of the other latch transistor. For example, the leakage transistor can be provided with a much greater gate oxide thickness, a longer channel, a narrower channel, or any combination of these.

Significantly, because the leakage transistor is of opposite conductivity type, it can be fabricated with essentially no increase in chip area, and does not require the more complex fabrication of a depletion-mode transistor, such as are sometimes provided where load resistors are required in various circuits.

In yet another specific form, the leakage current discharge path comprises a lightly-doped semiconductor region having a relatively high resistivity.

One advantageous aspect of the invention is that a memory cell structure embodying the memory cell circuit can be fabricated employing minimal change from conventional fabrication technology. Moreover, the high impedance leakage current discharge path, whether it is in the form of an IGFET or a lightly-doped semiconductor region, in a practical structure extends between the drain of the other latch transistor, for example, a P+ conductivity type region, and a P+ conductivity type region employed to establish an ohmic contact to a potential well within which any one of the several N-channel IGFETs are defined. Significantly, these regions exist on the chip in any event, and no additional area need be provided for them.

One particular memory cell structure in accordance with the invention is included in an integrated circuit memory formed on an N$^-$ conductivity type semiconductor substrate in which the P-channel IGFETs are defined. The overall memory includes a pair of complementary data input/output lines and an address line carrying cell-enabling signals. The cell includes a well region of opposite conductivity type, e.g. of P$^-$ conductivity type, formed within the N$^-$ conductivity type substrate and including at least one well portion. The P$^-$ well region portions serve as a substrate in which the N-channel IGFETs are defined. The cell also includes a pair of voltage supply nodes, and an ohmic contact between the well region and one of the voltage supply nodes, e.g., the ground voltage supply node. The ohmic contact includes a heavily-doped contact region of the opposite conductivity type, e.g. of P+ conductivity type, at a surface of the substrate and laterally adjoining the P$^-$ well region.

The cell additionally includes a pair of complementary data input/output nodes. Directly associated with the data nodes is a latch for actively storing the one of the logic states. The latch includes a complementary pair of insulated-gate field-effect transistors, one of the latch transistors being of the one channel conductivity type, e.g. is an N-channel IGFET, and having source and drain regions of the one conductivity type (N+ conductivity type) formed within the P$^-$ well region and respectively electrically connected to the one voltage supply node (ground) and to one of the data nodes. The one latch transistor has an insulated gate electrode on the substrate configured for inducing a conduction channel between the one latch transistor source and drain regions and electrically connected to the other of the data nodes.

The other of the latch transistors is of the opposite conductivity type, e.g. a P-channel IGFET, and has source and drain regions of the opposite conductivity (e.g. P+ conductivity type) formed within the N$^-$ substrate and respectively electrically connected to the other of the voltage supply nodes (+V$_{DD}$) and to the other of the data nodes. The P+ drain region of the other latch transistor is laterally spaced from the heavily-doped P+ contact region, defining a gap therebetween. The other latch transistor has an insulated gate electrode on the substrate configured for inducing a conduction channel between the other latch transistor source and drain regions and electrically connected to the one data node.

In two particular embodiments, a high impedance leakage current discharge path extends within the gap between the other latch transistor drain region and the heavily-doped contact region. In one form, the high impedance leakage current discharge path comprises an enhancement-mode IGFET having a channel of opposite conductivity type (a P-channel IGFET) defined by an insulated gate electrode configured for inducing a conduction channel of relatively lower conductivity than the conduction channel of the other latch transistor in the gap between the drain region of the other latch transistor and the heavily-doped contact region, and electrically connected to the one voltage supply node. In another form, the high impedance current discharge path comprises a lightly-doped semiconductor region formed in the gap between the drain region of the other latch transistor and the heavily-doped contact region. In either case, no additional chip area is provided for the high impedance leakage current discharge path.

In another particular embodiment, the high impedance leakage path comprises a reverse-biased PN junction diode between a P$^-$ well region portion and a terminal region of one of the N-channel IGFETs in the cell.

The cell structure additionally includes an active pull-up insulated-gate field-effect transistor of the opposite channel conductivity type. In this example, the active pull-up transistor is a P-channel IGFET, and is referred to as a "pull-up" transistor because it is connected to pull the one data node to +V$_{DD}$ when conducting. However, it will be appreciated that, in equivalent circuit configurations also embodying the invention, the active pull-up transistor will pull its associated data node to ground or to −V$_{DD}$, and the term "pull-up" is intended to cover these situations as well. The active pull-up transistor has source and drain regions of the opposite conductivity type (e.g. P+ regions) formed within the N$^-$ conductivity type substrate and respectively electrically connected to the other voltage supply node (circuit ground) and to the one of the data nodes. The active pull-up transistor has an insulated gate electrode on the substrate configured for inducing a conduction channel between the pull-up transistor source and drain regions and electrically connected to the other data node.

Tthe memory cell structure also comprises a gating circuit including a pair of IGFETs, each gating IGFET including a pair of main terminal regions and an insulated gate electrode configured for inducing a conduction channel between the main terminal regions. One of the main terminal regions of one of the gating transistors is electrically connected to one of the data lines, and the other of the main terminal regions of the one gating transistor is electrically connected to the one data node. Similarly, one of the main terminal regions of the other gating transistor is electrically connected to the other of the data lines, and the other of the main terminal regions of the other gating transistor is electrically connected to the other data node. The gate electrodes of the gating transistors are electrically connected to the address line for controlling conduction between the main terminal regions of the gating transistors. Typically, the gating transistors are of the one channel conductivity type (N-channel IGFET), and the gating transistor main terminal regions are of the one conductivity type (e.g. N+ conductivity type) and are formed within the well region (of P$^-$ conductivity type). In this case, the reverse-biased PN junction diode inherent in the other gating transistor can serve as the leakage current discharge path.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description taken in conjunction with the drawings, in which:

DETAILED DESCRIPTION OF THE PREFERRED EMBODIMENTS

Figure 1:
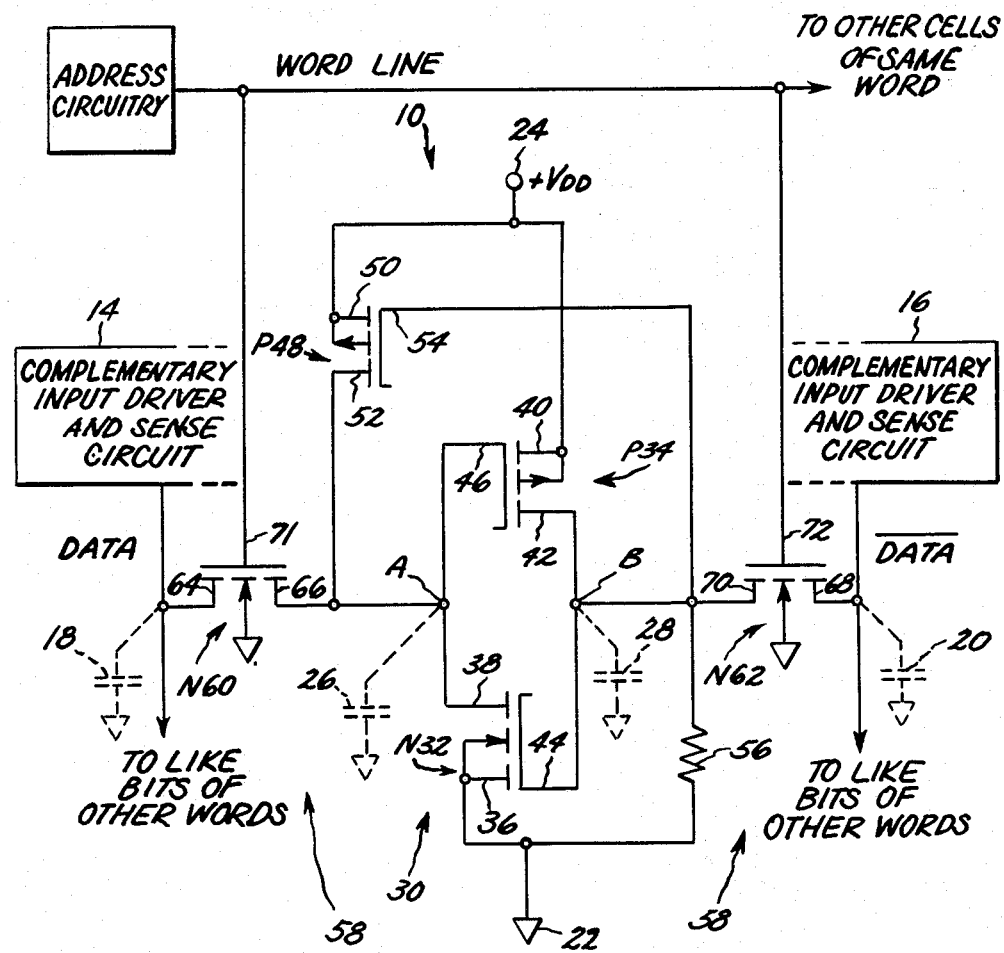
FIG. 1 is an electrical schematic diagram depicting one embodiment of memory cell in accordance with the invention wherein the high impedance leakage current discharge path is depicted as a resistor.

It is believed that the invention, its operation and its advantages will be better understood in view of a preliminary review of the characteristics of IGFETs of the type employed in static memory cells. It will be appreciated that the term insulated-gate field-ffect transistor (IGFET) is employed herein a generic sense to include various similar field-effect transistor devices such as metal-oxide-semiconductor field-effect transistors (MOSFETs), metal-insulator-semiconductor field-effect transistors (MISFETs), and metal-oxide-semiconductor transistors (MOSTs).

In the FIGS., only enhancement-mode IGFETs are shown, designated in conventional fashion by means of a broken channel bar symbol. An N-channel IGFET is indicated by an arrow extending inward to the central element of the broken bar and a P-channel IGFET is indicated by an arrow extending outward from the central element of the broken bar. Also, for convenience, P-channel IGFETs are further identified by the letter P followed by a particular reference numeral, and N-channel IGFETs are further identified by the letter N followed by a particular reference numeral.

In further pertinent review, each IGFET has a pair of main terminals (source and drain) which define the ends of its conduction channel, as well as an insulated gate electrode, the applied potential on which determines the conductivity of the conduction channel. For a P-channel IGFET, the source terminal is defined as that one of the main terminals having the more positive (higher) voltage potential applied thereto. For an N-channel IGFET, the source terminal is defined as that one of the main electrodes having the more negative (lower) voltage potential applied thereto. In either case, conduction occurs when the applied gate-to-source potential ($V_{GS}$) is both of the proper polarity to turn on the transistor, and is greater in magnitude than the threshold voltage $V_T$ of the particular transistor. The requirement that the gate-to-source potential exceeds the threshold potential $V_T$ to turn ON an IGFET may for convenience be termed "threshold voltage $V_T$ offset".

To turn on a P-channel IGFET, the gate voltage ($V_G$) must be more negative than the source voltage $V_S$ by at least $V_T$. To turn on an N-channel IGFET, $V_G$ must be more positive than $V_S$ by at least $V_T$.

In addition to the general operational characteristics of IGFETs, summarized immediately above, it is well known that specific IGFETs can be configured during fabrication to have any one of a variety of particular device characteristics. For example, threshold voltage $V_T$ and conductivity can be significantly affected through choice of channel dimensions and choice of gate insulating layer thickness.

The IGFETs employed are essentially symmetrical devices in structure wherein the source and drain regions may be interchanged. In the case of the latching and active pull-up transistors, one main terminal is always the source, and is so schematically represented by placement of the gate terminal at the source end of the device. In the case of the gating transistors, it is not strictly possible to designate which main terminal is the source and which is the drain because, in operation, they alternate in view of the operation of the gating transistors in a transmission gate mode.

Finally, it should be noted that in the following discussion a potential at, or near, ground is arbitrarily defined as logic "low" (or binary "0"), and any potential at or near $+V_{DD}$ volts is arbitrarily defined as logic "high" (binary "1").

Referring now to the drawings, FIG. 1 is an electrical schematic diagram of a single memory cell, generally designated 10, in accordance with the invention. As will be understood by those skilled in the art, the memory cell 10 is but a small portion of a complete random-access memory including an array of many such cells arranged in rows and columns in a conventional manner, and organized into a plurality of memory words, for example, each having a number of individual cells corresponding to the number of bits per word.

Considering first the circuitry external to the cell 10 required to operate the cell 10, the cell 10 is addressed or enabled by a WORD line, which may also be viewed as an address line, and which is driven by suitable address circuitry 12, as is well known in the art. The address or WORD line is also connected to all other cells of the same memory word.

Also connected to the cell 10 are complementary DATA and $\overline{\text{DATA}}$ lines used for input and output. The DATA and $\overline{\text{DATA}}$ lines are connected to a complementary input driver and sense circuit, designated schematically in two circuitry parts 14 and 16. Associated with the DATA and $\overline{\text{DATA}}$ lines are parasitic capacitances schematically depicted in phantom lines as capacitors 18 and 20.

For writing data into the memory cell 10, the circuitry 14 and 16 functions as a complementary driver to place appropriate logic levels on the DATA and $\overline{\text{DATA}}$ lines. For writing, the DATA and $\overline{\text{DATA}}$ lines are complements of each other. For example, for writing a binary "1", the DATA line is driven high, while the $\overline{\text{DATA}}$ line is driven low. At the same time, the cell 10 is also addressed or enabled by suitably driving the WORD line to logic high. The precise order of events is not critical during a writing operation, and the WORD line may be driven high either before, concurrently with, or subsequently to the driving of the DATA and $\overline{\text{DATA}}$ lines to appropriate logic levels, as a matter of design convenience in the arrangement of the external address circuitry 12 and driver circuitry 14 and 16. Additionally, the DATA and $\overline{\text{DATA}}$ lines may be initially precharged to logic low by specific driver circuitry 14 and 16, inasmuch as these lines are precharged to logic low for a reading operation, described next, and it is generally advantageous, as a matter of overall memory design, to minimize the number of specific differences between reading and writing operation.

The circuitry 14 and 16 also functions to read data stored in the cell 10 by sensing voltage levels on the DATA and $\overline{\text{DATA}}$ lines at the same time the WORD line is driven high, following a precharge operation wherein the DATA and $\overline{\text{DATA}}$ lines are both driven to logic low and then allowed to float, described in detail hereinafter.

Considering the memory cell 10 itself, the cell 10 includes a pair of voltage supply nodes 22 and 24, which may also be viewed as voltage supply lines of the overall integrated circuit memory. In the memory cell 10, one of the voltage supply nodes 22 is at circuit reference or ground potential. The other voltage supply node 24 is at $+V_{DD}$ potential, for example, +5 volts.

The cell includes a pair of complementary data input/output nodes A and B corresponding respectively to the DATA and $\overline{\text{DATA}}$ lines. Parasitic capacitances are associated with the data nodes A and B, these capacitances being schematically represented by fixed capacitors 26 and 28 shown in phantom.

Directly associated with the data nodes A and B is a latch, generally designated 30, for actively storing one of the logic states. In the embodiment of FIG. 1, the one logic state actively stored by the latch 30 represents a binary "0" wherein the one node A is at logic low and the other node B is at logic high. The term "actively storing" is employed herein in the sense that, when the one logic state is stored, both IGFETs comprising the latch 30, as described next, are in their conducting state, actively pulling both data nodes A and B to the proper respective logic levels.

More particularly, the latch 30 includes a complementary pair of IGFETs, an N-channel IGFET N32, and a P-channel IGFET P34. One of the latch IGFETs, i.e. transistor N32, has its source 36 and drain 38 terminals connected respectively to the ground voltage supply node 22 and the one data node A so as to pull the data node A low when conducting. The other latch IGFET, transistor P34, has its source 40 and drain 42 terminals connected respectively to the $+V_{DD}$ voltage supply node 24 and the other data node B so as to pull the data node B high when conducting. The gate 44 of the latch transistor N32 is connected to the data node B, and the gate 46 of the latch transistor P34 is connected to the data node A.

It will be appreciated that the complementary pair of latch transistors N32 and P34 will maintain indefinitely the logic state wherein the data node A is low, the data node B is high, and both transistors N32 and P34 are conducting, so long as voltage supply to the cell 10 remains and so long as logic levels are not forced into the data nodes A and B during a writing operation. In particular, with transistor N32 conducting, node A is pulled low. Since the gate 46 of P-channel transistor P34 is connected to node A and thus driven to a more negative voltage than its source 40 (connected to $+V_{DD}$), the transistor P34 is turned fully ON, pulling the data node B high. Similarly, since the gate 44 of the N-channel transistor N32 is connected to the data node B, the gate 44 is pulled high and is more positive than the source terminal 36 connected to circuit ground 22, thus maintaining the latch transistor N32 in its ON condition.

Significantly, the memory cell 10 is asymmetrical with respect to the mechanisms for storing a binary "0", as just described, and for storing a binary "1". In particular, there is not a corresponding complementary pair of latch transistors for storing a binary "1" wherein the data node A is at logic high and the data node B is at logic low.

For storing a binary "1" a P-channel IGFET P48 is provided, and is configured in the circuit as an active pull-up transistor. As noted above, the term "pull-up" is employed herein for convenience inasmuch as the transistor P48 actively pulls the node A to logic high. However, in equivalent circuit configurations also embodying the invention, the pull-up transistor P48 can pull its associated data node to logic low, and the term "pull-up" is intended to include this situation as well.

In the memory cell 10 of FIG. 1, the source terminal 50 of the active pull-up transistor P48 is connected to the $+V_{DD}$ voltage supply node 24, and the transistor drain terminal 52 is connected to the data node A. The transistor P48 gate terminal 54 is connected to the other data node B such that the pull-up transistor P48 is turned on when the data node B is low.

There is no corresponding active pull-up (or pull-down) transistor connected between the data node B and the ground voltage supply node 22. Rather, a high impedance leakage current discharge path, depicted schematically in FIG. 1 as a discrete resistor 56, electrically connects the data node B to the ground voltage supply node 22. The leakage current discharge path represented by the resistor 56 has a relatively high resistance, in the range of 100 megohms, or more, and need only be sufficient to discharge to ground any leakage current appearing on node B, for example, through the transistor P34. The leakage resistance 56 can take many forms, and need not comprise a discrete resistor at all.

Figure 2:
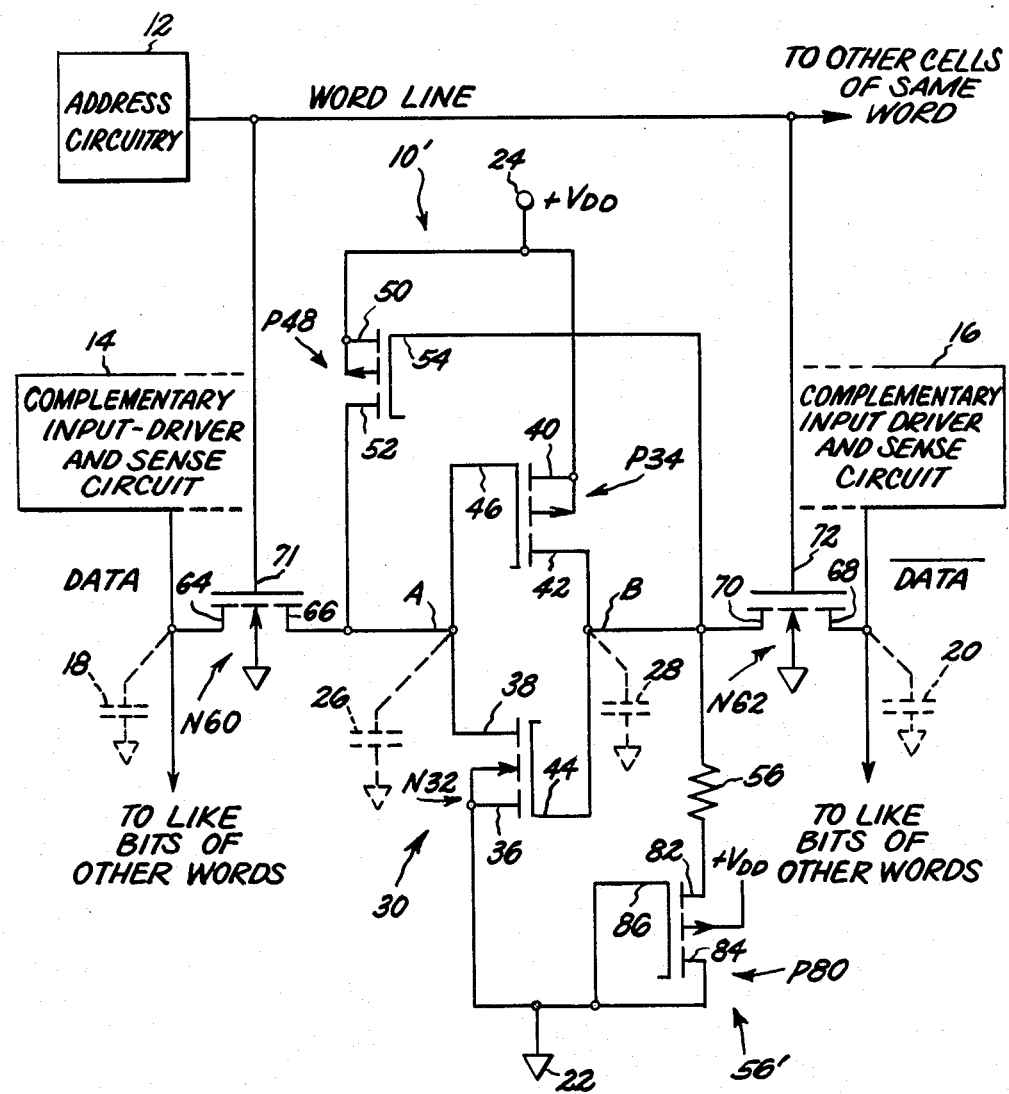
FIG. 2 is an electrical schematic diagram of another embodiment of the invention wherein the high impedance leakage current discharge path is shown as a P-channel enhancement-mode IGFET having its gate and drain terminals connected to each other.

Briefly, one particular form, described hereinafter with reference to FIG. 2, is a P-channel enhancement-mode IGFET of low channel conductivity having its gate and drain terminals connected together so as to always be turned ON. Alternatively, a lightly-doped semiconductor region may be employed. As another alternative, leakage through a gating transistor, also described hereinafter, may also be employed.

The FIG. 1 memory cell 10 maintains the binary "1" condition in the following manner. So long as the leakage resistance represented at 56 is sufficient to discharge any leakage to data node B (such as leakage from $+V_{DD}$ through transistor P34) and thus to maintain data node B at logic low, the P-channel active pull-up transistor P48 remains ON because its gate 54 is negative (at logic low) with respect to its source terminal 50, connected to $+V_{DD}$. Therefore, the data node A is actively pulled high. Data node B, once actively pulled low during a writing operation, remains low due to the leakage discharge resistance 56.

For coupling data into and out of the cell 10, there is a gating circuit, generally designated 58, comprising a pair of N-channel IGFETs N60 and N62. One main terminal 64 of one gating IGFET N60 is connected to the DATA line, and the other main terminal 66 of this same gating IGFET N60 is connected to the data node A. Similarly, one main terminal 68 of the other gating IGFET N62 is connected to the $\overline{\text{DATA}}$ line, and the other main terminal 70 of this other gating IGFET N62 is connected to the data node B. The gate terminals 71 and 72 of these gating IGFETs N60 and N62 are connected to the WORD line, such that the cell 10 is addressed or enabled when the WORD line is driven high by the address circuitry 12.

The operation of the memory cell 10 is described next by way of example, beginning first with a description of the writing operation, followed by a description of the reading operation.

For purposes of example, it will first be assumed that a binary "1" has previously been stored in this cell 10, and that accordingly the active pull-up transistor P48 is ON and the data node A is initially at logic high. The data node B is initially at logic low. Both latch transistors N32 and P34 are OFF.

To begin the operation of writing a binary "0", the driver circuitry 14 and 16 optionally precharges the DATA and $\overline{\text{DATA}}$ lines to logic low, discharging the parasitic capacitors 18 and 20, and then the DATA and $\overline{\text{DATA}}$ lines are allowed to float. Next, the address circuitry 12 drives the WORD line high, thus driving the gates 71 and 72 of the gating transistors N60 and N62 high, turning ON these transistors N60 and N62. The circuitry 14 and 16 then drives the DATA and $\overline{\text{DATA}}$ lines respectively to logic low and logic high. The gating transistor N62 terminal 70 is negative with respect to the terminal 68, which is connected to the $\overline{\text{DATA}}$ line. The terminal 70 therefore functions as the source terminal, and the transistor N62 operates as in a source-follower circuit configuration (for convenience referred to herein as "source-follower mode"). Initially, the transistor N62 gate 72 is clearly more positive than the source terminal 70, since that gate terminal 72 is fully at logic high and the source terminal 70 is fully at logic low. The data node B (or more particularly, the parasitic capacitance 28) begins to charge towards $+V_{DD}$ through the gating transistor N62, being substantially unopposed by the relatively high resistance of the leakage current discharge resistor 56. Since the gate 54 of the active pull-up transistor P48 is connected to the node B, which is going high, the transistor P48 begins to turn off.

At the same time, the data node A is being pulled low through the gating transistor N60 to the DATA line. Gating transistor N60 terminal 64 is negative with respect to terminal 66, and the terminal 64 therefore functions as the source terminal and the transistor N60 operates as in a common-source circuit configuration (for convenience referred to herein as "common-source mode"). The gating transistor N60 turns on, discharging the parasitic capacitance 26 and pulling the data node A to logic low. The data node A can be pulled to logic low because, at the same time as described above, the active pull-up transistor P48 is being turned OFF. As data node A goes low, latch transistor P34 is turned ON since its gate 46 is connected to data node A, completing the task of pulling data node B to logic high. At the same time, as data node B goes to logic high, being pulled both through gating transistor N62 and latch transistor N32, latch transistor N32 is turned ON, since its gate 34 is connected to data node B. Transistor N32 pulls data node A low to latch the cell 10 in its binary "0" condition with both transistors N32 and P34 ON. Thus the latching operation is regenerative. It may be noted that, although the gating transistor N62 is operating in the source-follower mode, and thus cannot pass the full $+V_{DD}$ supply voltage due to threshold voltage offset if the WORD line is itself at only $+V_{DD}$, the latch transistor P34 actively pulls the node B fully to logic high. The WORD line is then driven low, turning off the gating transistors N60 and N62, and the cell 10 maintains this logic state indefinitely, until a subsequent writing operation, or until voltage supply is removed.

At this point, the operation of writing a binary "1" into the cell may be considered. Initially, both latch transistors N32 and P34 are ON, node A is at logic low and node B is at logic high. To commence the writing operation, following precharge, the WORD line is driven high to turn ON the gating transistors N60 and N62, the DATA line is driven high, and the $\overline{\text{DATA}}$ line is driven low. Thus, the gating transistor N62, operating in the common source mode, begins to pull the data node B to logic low. At the same time, the gating transistor N60, operating in the source-follower mode, begins to pull the data node A towards logic high. This action begins to turn OFF the transistors N32 and P34, and to turn ON the transistor P48. As the latch transistor N32 turns off, the active pull-up transistor P48 pulls the data node S fully to logic high. As the latch transistor P34 turns off, the gating transistor N62 pulls the data node B fully to logic low. When the voltage on the WORD line is removed, turning off the gating transistors N60 and N62, the cell 10 maintains this logic state.

Although the gating transistor N60 is operating in the source-follower mode, and thus cannot pass the full $+V_{DD}$ supply voltage due to threshold voltage offset if the WORD line is itself at only $+V_{DD}$, the active pull-up transistor P48 eventually pulls the node A fully to logic high. Any increase of voltage on node A decreases the conductivity of the latch transistor P34, allowing the voltage on data node B to decrease due to discharge through the gating transistor N62. Through a regenerative switching operation, P34 and N32 are eventually fully turned off.

Considering now reading operation, the memory cell 10 can be read in a conventional manner, so long as the DATA and $\overline{\text{DATA}}$ lines are precharged to logic low (ground) prior to a reading operation.

Assuming first, for purposes of example, that the cell 10 is storing a binary "0" wherein node A is low and node B is high and both latch transistors N32 and P34 are conducting, the DATA and $\overline{\text{DATA}}$ lines are precharged low, and then allowed to float. When the WORD line goes high, the gating transistors N60 and N62 are turned ON. The DATA line is discharged to logic low through gating transistor N60 (operating in the common-source mode) and through latch transistor N32. At the same time, the other latch transistor P34 maintains the data node B at logic high, and the $\overline{\text{DATA}}$ line is pulled to logic high through gating transistor N62 operating in the source-follower mode.

In the complementary case, i.e. when a binary "1" is stored in the cell 10, both latch transistors N32 and P34 are OFF, the active pull-up transistor P48 is ON actively pulling the data node A high, and the data node B is at logic low. The DATA and $\overline{\text{DATA}}$ lines are initially precharged to ground, and allowed to float. The WORD line goes high, turning on the gating transistors N60 and N62. Since active pull-up transistor P48 is maintaining data node A at logic high, the DATA line and the parasitic capacitance 18 are pulled towards logic high by the gating transistor N60 operating in the source-follower mode. The voltage on the $\overline{\text{DATA}}$ line does not change, i.e. remains at logic low, when the gating transistor N62 is turned on, since the data node B is low.

The increase in potential on the DATA line and the lack of change on the $\overline{\text{DATA}}$ line are sensed by the sense circuitry 14 and 16, which recognizes that a binary "1" was stored in the cell 10.

As noted above, the high impedance leakage current discharge path for the data node B may be provided in a number of different ways, and the resistor 56 depicted in FIG. 1 is a schematic representation only. As one example, the gating transistor N62 may itself be fabricated with sufficient leakage either to ground or to the $\overline{\text{DATA}}$ line to discharge the data node B. As is known, a reverse-biased PN junction diode is inherently included within the structure of an IGFET fabricated on bulk single-crystal substrate, as will be apparent hereinafter with reference to FIG. 3. In the case of the N-channel gating IGFET N62, the terminal 70 is of N+ conductivity type and is formed within a well region of P− conductivity type, which is connected to circuit ground. This junction diode can be fabricated so as to have the desired degree of leakage.

Alternatively, the gating transistor N62 can be fabricated so as to have sufficient leakage between its main terminal 68 and 70, and data will be maintained in the cell 10 so long as the DATA and $\overline{\text{DATA}}$ lines are normally maintained at their precharge (logic low) states.

Another form which a leakage current discharge path 56' can be included in a cell 10' is shown in FIG. 2. FIG. 2 is identical in all respects to FIG. 1, with the exception of the alternative form of leakage current discharge path 56' included in the cell 10' of FIG. 2.

In particular, the FIG. 2 leakage current discharge path 56' comprises an enhancement-mode IGFET P80 having a channel of P-conductivity type, the same as the channels of the latch transistor P34 and the active pull-up transistor P48. The IGFET P80 serves as a leakage transistor. The transistor P80 source terminal 82 is connected to the data node B, and the transistor P80 drain terminal 84 is connected to the ground voltage supply node 22. The gate 86 of the transistor P80 is also connected to the ground voltage supply node 22, and thus to the transistor P80 drain terminal 84. With this arrangement, the transistor P80 gate voltage is always more negative than the transistor P80 source 82 voltage, and the transistor P80 is always ON when voltage is applied between its source 82 and drain 84 terminals. However, the leakage transistor P80 is configured so as to have a relatively lower conductivity relative to the conductivity of the latch transistor P34, through suitable fabrication. This can be accomplished, for example, by providing a relatively thick gate insulating layer, and a channel of relatively narow width. Advantageously as will be apparent from the following description with reference to FIG. 3, the leakage transistor P80, since it is a P-channel type, can share a common terminal region with the drain 42 of the latch transistor P34, and another common terminal region with the contact region used to connect the P− conductivity type substrate or well portions for the N-channel transistors in the memory cell 10' to ground. Thus, the leakage transistor P80 can be fabricated with no increase in chip area required.

Figure 3:
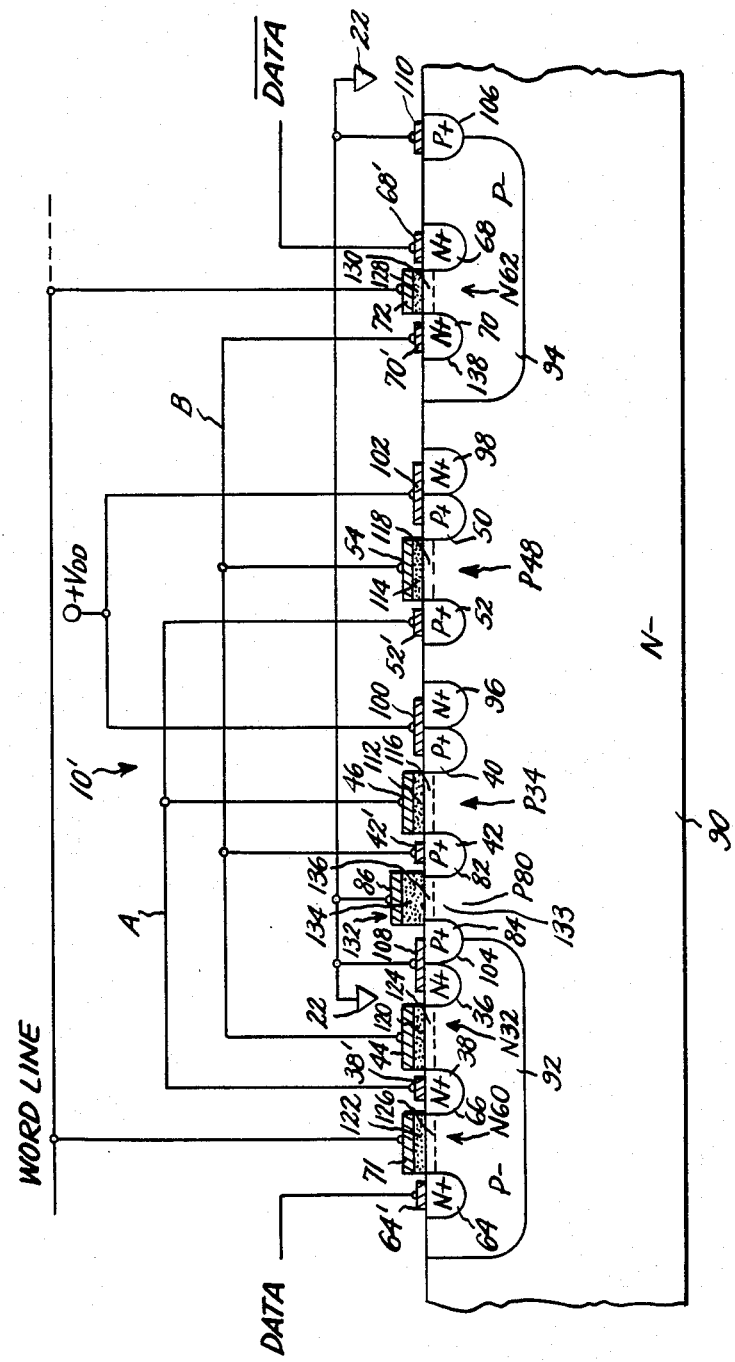
FIG. 3 is a highly-schematic cross-sectional representation of the physical structure of a memory cell in accordance with the invention and corresponding to the circuit of FIG. 2.

With reference now to FIG. 3, a specific structure implementing the circuit of FIG. 2 will now be described. For convenience, identical reference numerals are used in FIG. 3 to designate structural elements corresponding to symbols in the electrical schematic diagram of FIG. 2. Specifically, semiconductor terminal regions in FIG. 3 are designated with the same numerals as the main terminals of the various IGFETs in FIG. 2, and main terminal electrode metallization areas are designated with primed reference numerals.

It will be appreciated that, while FIG. 3 depicts one exemplary structure, it is nevertheless a highly schematic depiction, omitting a number of conventional features required in practical devices. Also, FIG. 3 is a cross-sectional view only, and indicates the required surface metallization pattern in a schematic manner only.

The memory cell structure of FIG. 3 is formed on a portion 90 of an N− conductivity type silicon semiconductor substrate or wafer which, as will be appreciated, is but a small portion of an overall integrated circuit memory substrate including a multiplicity of individual memory cells. The P− conductivity type substrate required for complementary N-channel IGFETs is obtained by implanting a lighly-doped well region comprising portions 92 and 94 into the N− conductivity type substrate 90.

In order to maintain the N− conductivity type substrate 90 at $+V_{DD}$ potential, an ohmic contact to $+V_{DD}$ is provided by means of redundant heavily-doped N+ conductivity type contact regions 96 and 98 diffused into the substrate 90 and in ohmic contact with $+V_{DD}$ via contact metallization areas 100 and 102.

Similarly, in order to maintain the P− conductivity type well regions portions 92 and 94 at ground potential, ohmic contacts are provided in the form of heavily-doped P+ contact regions 104 and 106 laterally adjoining the P− well portions 92 and 94 and connected to circuit ground 22 via respective metallization areas 108 and 110. So long as proper supply voltage is supplied to the cell 10, all PN junction diodes defined within the substrate 90 are reverse biased.

The P-channel IGFETs P34 and P48 are formed within the N− conductivity type substrate 90 in conventional fashion by providing P+ conductivity type terminal regions 40, 42, 50, and 52, employing conventional techniques. Drain electrode metallization 42' is provided for the IGFET P34 and connected to the data node B, and drain electrode metallization 52' is provided for the transistor P48 and connected to the data node A. The P+ conductivity type source regions 40 and 50 of the IGFETs P34 and P48 are formed immediately adjacent the N+ conductivity type contact regions 96 and 98, and share the same metallization areas 100 and 102 connected to $+V_{DD}$. To complete the structures of the P-channel IGFETs P34 and P48, their respective gate electrodes 46 and 54 are spaced from the substrate 80 by insulating layers 112 and 114. The insulating layers 112 and 114 may comprise any suitable insulating material, for example silicon dioxide. The gate electrodes 46 and 54 themselves may comprise any suitable conductive material, such as aluminum or highly-doped polysilicon.

Since the IGFETs P34 and P48 are enhancement-mode devices, conduction channels only exist when induced by suitable voltage on the gate electrodes 46 and 54, these induced conduction channels being represented at 116 and 118.

The N-channel IGFETs N32, N60 and N62 are formed within the P− conductivity type well portions 92 and 94. In the particular embodiment illustrated in FIG. 3, the transistors N32 and N60 are formed within the well region portion 92, and, in order to minimize chip area, share a common N+ conductivity type terminal region which serves both as the drain region 38 of the transistor N32 and as the terminal region 66 of the transistor N60. This common terminal region is connected to the data node A via metallization 38'. The N+ conductivity type terminal region 64 of the transistor N60 is connected to the DATA line via a metallized electrode 64'. The N+ conductivity type source terminal region 36 of the transistor N32 is connected to circuit ground through metallization 108, which also serves the P+ conductivity type contact region 84. The structures of the IGFETs N32 and N60 are completed by gate electrodes 44 and 71 having respective gate insulating portions 120 and 122 and configured for inducing respective conduction channels 124 and 126 when appropriate gate voltage is applied via the WORD line. Gate electrode 44 is connected to node B. Gate electrode 71 is connected to the word line.

In the FIG. 3 embodiment, the remaining N-channel transistor, N62, is formed within the P− conductivity type well portion 94, and includes N+ conductivity type terminal regions 68 and 70 respectively connected to the $\overline{\text{DATA}}$ line and to the data node B through electrode metallization 68' and 70'. The gate electrode 72 of the transistor N62 is spaced from the surface of the well 94 by a gate insulating layer 128 and configured for inducing a conduction channel 130. Gate electrode 72 is connected to the word line.

The final element depicted in FIG. 3 is the enhancement-mode IGFET P8. Advantageously, the transistor P80 can be provided with no increase in chip area by utilizing, as its P+ conductivity type terminal regions, P+ regions which existed in any event of the N− conductivity type substrate 90. In particular, the drain terminal region 42 of the IGFET P34 serves also as the source terminal region 82 of the leakage current transistor P80, and the heavily-doped P+ conductivity type contact region 104 for connecting the P− well portion 92 to circuit ground serves also as the drain terminal 84 of the leakage current transistor P80. An insulated gate structure 132 is provided on the substrate 90 surface on the gap 133 between these two P+ conductivity type regions, the insulated gate structure 132 comprising gate electrode metallization 86 and a gate insulating layer 134. The gate electrode structure 132 serves to induce a conduction channel 136 when voltage is applied to the gate electrode 86, which electrode is connected to the transistor P80 drain 84 and to circuit ground.

The leakage transistor P80 is configured so as to have a conductivity much lower (i.e. a much higher impedance) than the latch transistor P34. This may be accomplished in a number of ways. For example, as depicted in FIG. 3, the gate insulating layer 134 may be made much thicker than the gate insulating layers of the other devices, e.g. the gate insulating layer 112 of the transistor P34. Correspondingly, the induced conduction channel 136 is drawn somewhat smaller than the conduction channels of the other transistors, for example, than the conduction channel 116 of the transistor P34.

An alternative way in which the high impedance leakage current discharge path may be provided is through the gating transistor N62. In particular, a reverse-biased PN junction diode is formed between the N+ conductivity type terminal region 70 and the P− conductivity type well portion 94, which well portion 94 is maintained at circuit ground via the ohmic contact region 106 and the metallization 110. Through suitable process design, this PN junction diode 138 can be made to have a slight leakage, sufficient to discharge the data node B to ground, thus serving as a high impedance leakage current discharge path 56.

Another leakage path within the gating transistor N62 which can comprise the leakage current discharge path 56 for the data node B is between the main terminals 68 and 70. This leakage, then, is from the data nodes B to the $\overline{\text{DATA}}$ line, and also may be provided through suitable process design. The circuit function, particularly that of the circuitry 14 and 16 (FIG. 1) must be such that at least $\overline{\text{DATA}}$ line is generally maintained at its precharged (logic low) level, if long periods of static operation are desired without loss of data.

Figure 4:
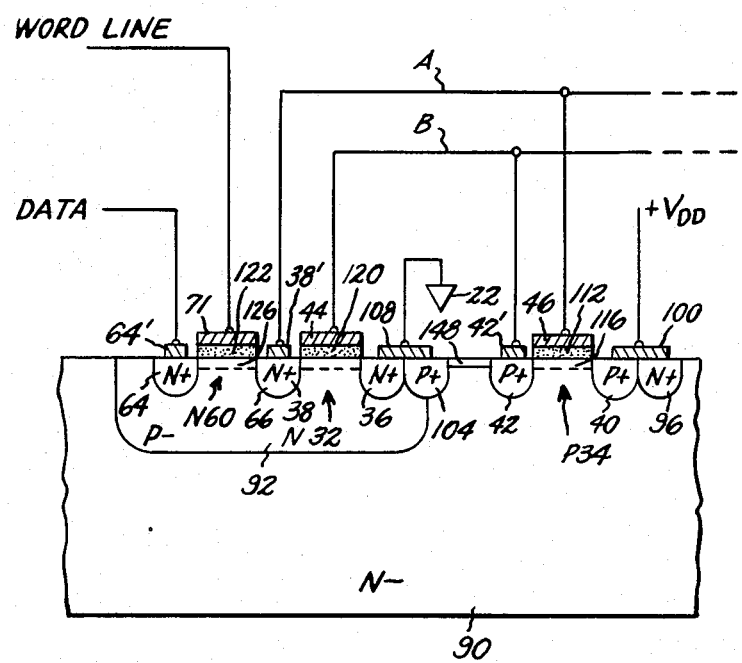
FIG. 4 is a partial cross-sectional representation of the physical structure of a memory cell showing an alternative form of high impedance leakage current discharge path.

Referring finally to FIG. 4, depicted is another structure for providing the high impedance leakage current discharge path. FIG. 4 depicts a portion of the FIG. 3 structure, all other portions being unchanged. In FIG. 4, the leakage transistor P80 is not included. Rather, a lightly-doped semiconductor region 148 is formed in the gap between the latch transistor P34 drain region 42 and the P+ conductivity type contact region 104. Typically, the lightly-doped semiconductor region is formed by implanting P-type semiconductor impurities.

While specific embodiments of the invention have been illustrated and described herein, it is realized that numerous modifications and changes will occur to those skilled in the art. For example, the circuit of FIG. 1 can be rearranged by replacing the pull-up transistor P48 with a leakage current discharge path and by replacing the resistor 56 with an N-channel "pull-down" transistor having its gate connected to data node A. As another example, the $V_{DD}$ voltage can be made negative with respect to the reference potential, and the transistor conductivity type, changed to the opposite type in each case. Similarly it will be appreciated that a variety of structural arrangements may be employed. It is therefore to be understood that the appended claims are intended to cover all such modifications and changes as fall within the true spirit and scope of the invention.

What is claimed is:

1. A binary memory cell for connection to a pair of complementary data input/output lines and to an address line carrying cell-enabling signals, said cell capable of storing either of a pair of digital logic states and comprising:

a pair of voltage supply nodes;

a pair of complementary data input/output nodes a latch for actively storing one of the logic states, said latch including a complementary pair of insulated-gate field-effect transistors, one of said active latch transistors having a channel of one conductivity type arranged to selectively electrically connect one of said data nodes to one of said voltage supply nodes, the other of said active latch transistors having a channel of opposite conductivity type arranged to selectively electrically connect the other of said data nodes to the other of said voltage supply nodes, the gate of said one latch transistor being electrically connected to said other data node, and the gate of said other latch transistor being electrically connected to said one data node;

an active pull-up insulated-gate field-effect transistor having a channel of the opposite conductivity type arranged to selectively electrically connect said one data node to said other voltage supply node, the gate of said active pull-up transistor being electrically connected to said other data node;

a high impedance leakage current discharge path electrically connecting said other data node to said one voltage supply node; and a gating circuit including a pair of insulated gate field-effect transistors, the channel of one gating transistor arranged to selectively electrically connect said one data node to one of the data lines, the channel of the other gating transistor arranged to selectively electrically connect said other data node to the other data line, and the gates of said gating transistors arranged for connection to the address line for controlling conduction through the channels of said gating transistors.

2. A memory cell in accordance with claim 1, wherein said gating transistors have channels of the one conductivity type.

3. A memory cell in accordance with claim 1, wherein:
said other of said pair of voltage supply nodes is a positive voltage supply node with respect to said one of said voltage supply nodes;
said one of said active latch transistors is an N-channel insulated-gate field-effect transistor; and
said other of said active latch transistors and said active pull-up transistor are P-channel insulated-gate field-effect transistors.

4. A memory cell in accordance with claim 2, wherein:
said other of said pair of voltage supply nodes is a positive voltage supply node with respect to said one of said voltage supply nodes;
said one of said active latch transistors and said gating transistors are N-channel insulated-gate field-effect transistors; and
said other of said active latch transistors and said active pull-up transistor are P-channel insulated-gate field-effect transistors.

5. A memory cell in accordance with claim 1, wherein said high impedance leakage current discharge path comprises an enhancement-mode insulated-gate field-effect transistor having a channel of the opposite conductivity type, the source of said leakage transistor being electrically connected to said other data node, the drain and gate of said leakage transistor being electrically to said one voltage supply node, and said leakage transistor being configured so as to have a relatively lower conductivity relative to the conductivity of said other latch transistor.

6. A memory cell in accordance with claim 5, wherein:
said other of said pair of voltage supply nodes is a positive voltage supply node with respect to said one of said voltage supply nodes;
said one of said active latch transistors is an N-channel insulated-gate field-effect transistors; and
said other of said active latch transistors, said active pull-up transistor, and said leakage transistor are P-channel insulated-gate field-effect transistors.

7. A memory cell in accordance with claim 1, wherein said high impedance leakage current discharge path comprises a lightly-doped semiconductor region.

8. A memory cell in accordance with claim 2, wherein said high impedance leakage current discharge path comprises a leakage path included within said other gating transistor.

9. A memory cell in accordance with claim 8, wherein said leakage path included within said other gating transistor is between said other data node and said one voltage supply line.

10. A memory cell in accordance with claim 8, wherein said leakage path included within said other gating transistor is between said other data node and the other data line.

11. In an integrated circuit memory formed on a semiconductor substrate of one conductivity type and including a pair of complementary data input/output lines and an address line carrying cell-enabling signals, a memory cell capable of storing either of a pair of digital logic states and comprising
a well region of opposite conductivity type formed within the substrate and including at least one well portion;
a pair of voltage supply nodes;
an ohmic contact between said well region and one of the voltage supply nodes, said ohmic contact including a heavily-doped contact region of the opposite conductivity type at a surface of the substrate and laterally adjoining said well region;
a pair of complementary data input/output nodes;
a latch for actively storing one of the logic states, said latch including a complementary pair of insulated-gate field-effect transistors, one of the latch transistors being of the one channel conductivity type and having source and drain regions of the one conductivity type formed within the well region and respectively electrically connected to said one voltage supply node and to one of the data nodes, and having an insulated gate electrode configured for inducing a conduction channel between said one latch transistor source and drain regions and electrically connected to the other of the data nodes, the other of the latch transistors being of the opposite channel conductivity type and having source and drain regions of the opposite conductivity type formed within the substrate and respectively electrically connected to the other of said voltage supply nodes and to the other of said data nodes, said drain region of said other latch transistor being laterally spaced from said heavily-doped contact region and defining a gap therebetween, and said other latch transistor having an insulated gate electrode configured for inducing a conduction channel between said other latch transistor source and drain regions and electrically connected to the one data node;
a high impedance leakage current discharge path extending within said gap between said other latch transistor drain region and said heavily doped contact region;
an active pull-up insulated-gate field-effect transistor of the opposite channel conductivity type and having source and drain regions of the opposite conductivity type formed within the substrate and respectively electrically connected to said other voltage supply node and to said one data node, and having an insulated gate electrode on the substrate configured for inducing a conduction channel between said pull-up transistor source and drain regions and electrically connected to said other data node; and
a gating circuit including a pair of insulated-gate field-effect transistors, each gating transistor including a pair of main terminal regions and an insulated gate electrode configured for inducing a conduction channel between the main terminal regions, one of said main terminal regions of one of said gating transistors electrically connected to one of the data lines, the other of said main terminal regions of said one gating transistor electrically connected to said one data node, one of said main terminal regions of the other gating transistor electrically connected to the other of the data lines, the other of said main terminal regions of the other gating transistor electrically connected to said other data node, and said gate electrodes of said gating transistors electrically connected to the address line for controlling conduction between said main terminal regions of said gating transistors.

12. A memory cell in accordance with claim 11, wherein said gating transistors are of the one channel conductivity type, and wherein said gating transistor main terminal regions are of the one conductivity type and are formed within the well region.

13. A memory cell in accordance with claim 11, wherein:
said other of said pair of voltage supply nodes is a positive voltage supply node with respect to said one of said voltage supply nodes;
said one latch transistor is an N-channel insulated-gate field-effect transistor; and
said other latch transistor and said active pull-up transistor are P-channel insulated-gate field-effect transistors.

14. A memory cell in accordance with claim 12, wherein:
said other of said pair of voltage supply nodes is a positive voltage supply node with respect to said one of said voltage supply nodes;
said one latch transistor and said gating transistors are N-channel insulated-gate field-effect transistors; and
said other latch transistor and said active pull-up transistor are P-channel insulated-gate field-effect transistors.

15. A memory cell in accordance with claim 11, wherein said high impedance leakage current discharge path comprises an enhancement-mode insulated gate field-effect transistor having a channel of the opposite conductivity type defined by an insulated gate electrode configured for inducing a conduction channel of relatively lower conductivity than the conduction channel of said other latch transistor in said gap between said drain region of said other latch transistor and said heavily-doped contact region and electrically connected to said one voltage supply node.

16. A memory cell in accordance with claim 15, wherein:
said high impedance leakage current discharge path comprises an enhancement-mode insulated-gate field-effect transistor having a channel of the opposite conductivity type, the source of said leakage transistor being electrically connected to said other data node, the drain and gate of said leakage transistor being electrically to said one voltage supply node, and said leakage transistor being configured so as to have a relatively lower conductivity relative to the conductivity of said other latch transistor.

17. A memory cell in accordance with claim 11, wherein said high impedance leakage current discharge path comprises a lightly-doped semiconductor region formed in said gap between said drain region of said other latch transistor and said heavily-doped contact region.

18. In an integrated circuit memory formed on a semiconductor substrate of one conductivity type and including a pair of complementary data input/output lines and an address line carrying cell-enabling signals, a memory cell capable of storing either of a pair of digital logic states and comprising:
a well region of opposite conductivity type formed within the substrate and including at least one well portion;
a pair of voltage supply nodes;
an ohmic contact between said well region and one of the voltage supply nodes;
a pair of complementary data input/output nodes;
a latch for actively storing one of the logic states, said latch including a complementary pair of insulated-gate field-effect transistors, one of the latch transistors being of the one channel conductivity type and having source and drain regions of the one conductivity type formed within the well region and respectively electrically connected to said one voltage supply node and to one of the data nodes, and having an insulated gate electrode configured for inducing a conduction channel between said one latch transistor source and drain regions and electrically connected to the other of the data nodes, the other of the latch transistors being of the opposite channel conductivity type and having source and drain regions of the opposite conductivity type formed within the substrate and respectively electrically connected to the other of said voltage supply nodes and to the other of said data nodes, and having an insulated gate electrode configured for inducing a conduction channel between said other latch transistor source and drain regions and electrically connected to the one data node;
an active pull-up insulated-gate field-effect transistor of the opposite channel conductivity type and having source and drain regions of the opposite conductivity type formed within the substrate and respectively electrically connected to said other voltage supply node and to said one data node, and having an insulated gate electrode on the substrate configured for inducing a conduction channel between said pull-up transistor source and drain regions and electrically connected to said other data node; and
a gating circuit including a pair of insulated-gate field-effect transistors of the one channel conductivity type, each gating transistor including a pair of main terminal regions of the one channel conductivity type and formed within the well region, and each gating transistor having an insulated gate electrode configured for inducing a conduction channel between the main terminal regions, one of said main terminal regions of one of said gating transistors electrically connected to one of the data lines, the other of said main terminal regions of said one gating transistor electrically connected to said one data node, one of said main terminal regions of the other gating transistor electrically connected to the other of the data lines, the other of said main terminal regions of the other gating transistor electrically connected to said other data node, and said gate electrodes of said gating transistors electrically connected to the address line for controlling conduction between said main terminal regions of said gating transistors; and
said other gating transistor being configured to have leakage to provide a high-impedance leakage current discharge path between said other main terminal region of said other gating transistor and said one voltage supply node.

19. A memory cell in accordance with claim 18, wherein said other gating transistor includes a reverse-biased PN junction diode defined between said other main terminal region of said other gating transistor and said well region, and said gating transistor is configured to have leakage through the defined PN junction diode sufficient to discharge leakage on said other data node.

20. A memory cell in accordance with claim 18, wherein said other gating transistor is configured to have leakage between said main terminal regions of said other gating transistor sufficient to discharge leakage current on said other data node when the other data line is at the potential of said one voltage supply node.

21. A memory cell in accordance with claim 18, wherein:

said other of said pair of voltage supply nodes is a positive voltage supply node with respect to said one of said voltage supply nodes;

said one latch transistor and said gating transistors are N-channel insulated-gate field-effect transistors; and said other latch transistor and said active pull-up transistor are P-channel insulated-gate field-effect transistors.

* * * * *